United States Patent [19]

Carlson et al.

[11] 4,063,050

[45] Dec. 13, 1977

[54] ACOUSTIC TRANSDUCER WITH IMPROVED ELECTRET ASSEMBLY

[75] Inventors: Elmer V. Carlson, Prospect Heights; Mead C. Killion, Elk Grove Village, both of Ill.

[73] Assignee: Industrial Research Products, Inc., Elk Grove Village, Ill.

[21] Appl. No.: 755,468

[22] Filed: Dec. 30, 1976

[51] Int. Cl.² .................... H04R 19/00; H04R 19/04
[52] U.S. Cl. ................................................ 179/111 E
[58] Field of Search ................ 179/111 R, 111 E, 179

Primary Examiner—George G. Stellar
Attorney, Agent, or Firm—Leo J. Aubel

[57] ABSTRACT

The present invention relates to an acoustic transducer including an improved electret assembly mounted in an improved case and having an electronic amplifier circuit comprising FET transistors. The electronic circuit further includes means for protecting the FET transistors against current surges.

10 Claims, 4 Drawing Figures

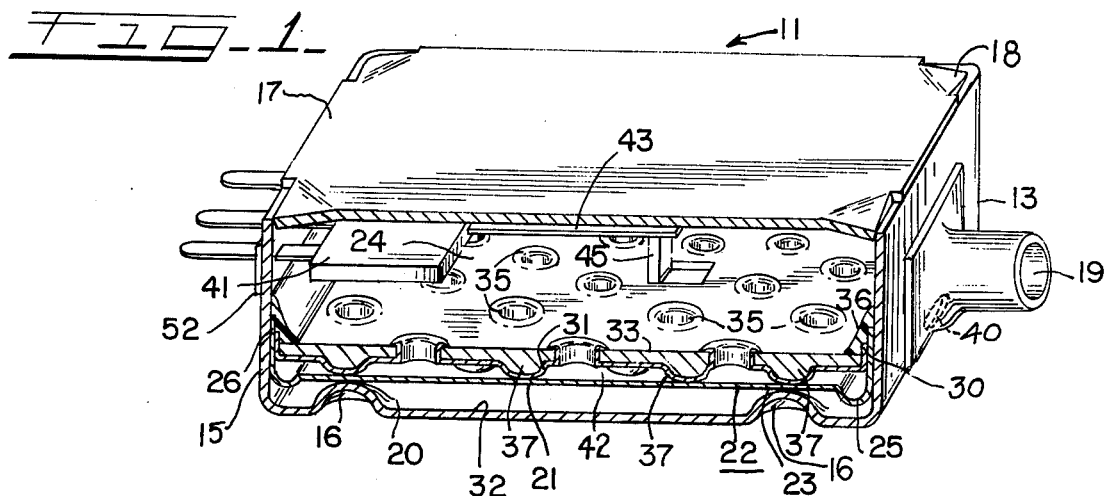
Fig-1
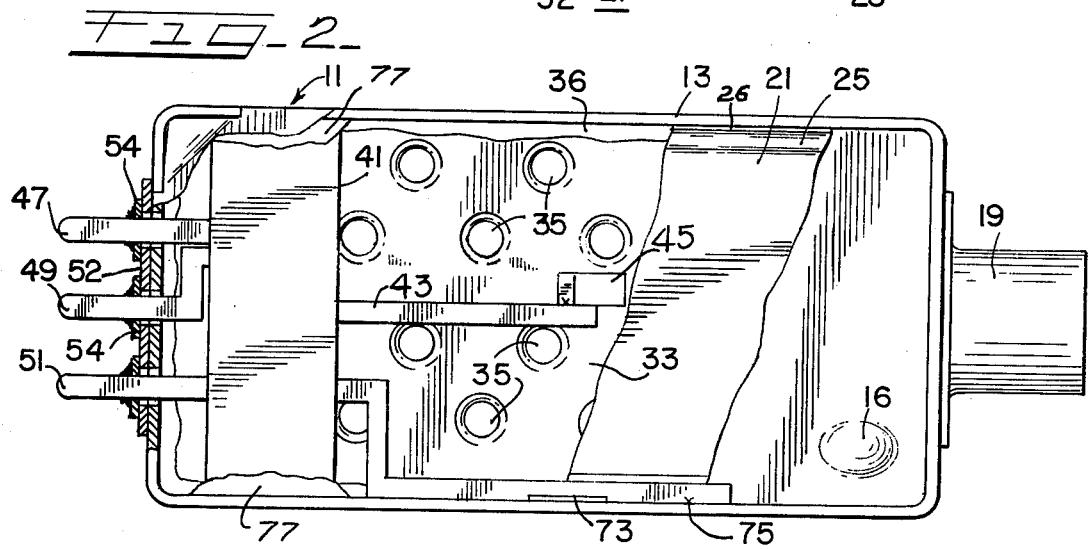
Fig-2
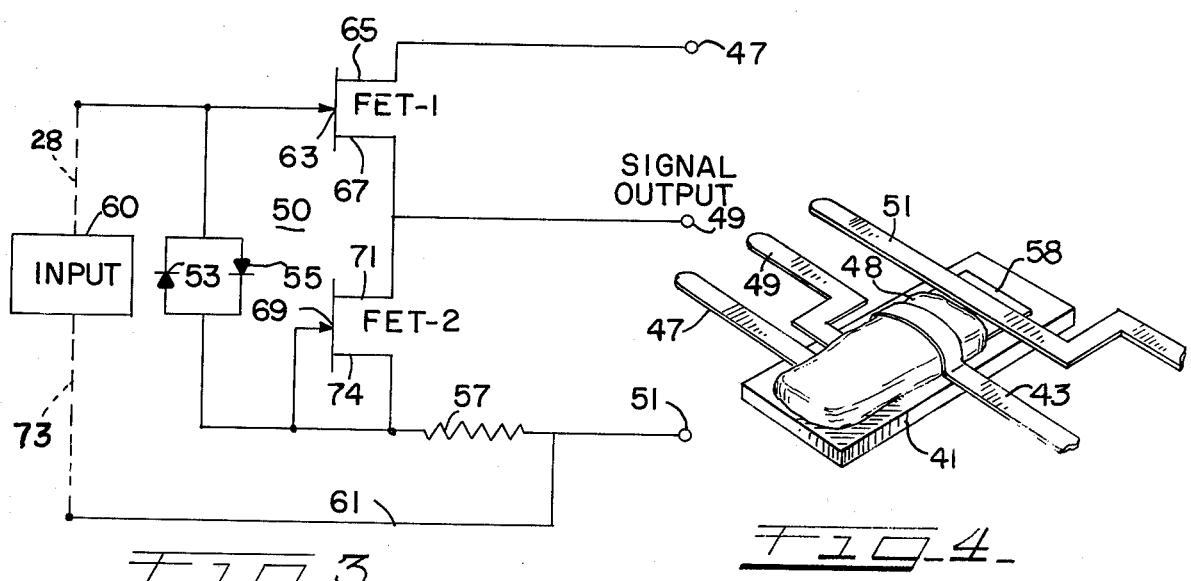
Fig-3
Fig-4

ACOUSTIC TRANSDUCER WITH IMPROVED ELECTRET ASSEMBLY

BACKGROUND OF THE INVENTION

The present invention relates to an acoustic transducer of the type comprising an electret assembly including a diaphragm mounted adjacent an electret film and a backplate. The electret assembly is mounted within a case to form acoustic chambers on opposite sides of the diaphragm. The case includes a conduit for permitting the external acoustic signal to enter into one of the acoustic chambers to enable the diaphragm to respond thereto. The backplate is perforated to permit the air pulsations created by the vibrations of the diaphragm to pass to the other acoustic chamber. And, the electret film is connected to suitable electronic circuitry to thereby permit the electroacoustical interaction of the diaphragm and electret film to provide an electrical signal representative of the acoustic signal.

As is known, the converse operation may be provided by the transducer in that an electrical signal may be applied to the electret to cause the diaphragm to vibrate and thereby develop an acoustic signal which can be coupled out of the first acoustic chamber.

A principal object of the present invention is to provide an improved construction for an acoustic transducer of the foregoing type. In the inventive transducer, the diaphragm, electret and backplate assembly are conveniently mounted on support posts formed in the case; this also forms an acoustic chamber into which external sound is admitted. The diaphragm includes flanges extending transversely from the plane of the diaphragm to permit secure adhesion thereof to the walls of the case.

The electret comprises a dielectric film deposited on a perforated backplate and the backplate includes protrusions which selectively space the dielectric film from a diaphragm. The foregoing structure permits the diaphragm, electret and backplate assembly to be mounted in the case in an acoustically efficient manner within a precise tolerance.

An electronic signal amplification circuit formed on a semiconductor die is mounted on a ceramic plate which is positioned within the case and is in part supported by a post attached to the backplate. The electronic circuit includes a pair of FET's (field effect transistors) and means for limiting current surges through the FET's. An electrical terminal comprising relatively rigid electrical leads connecting to the electronic circuit extend outwardly from the ceramic plate and through acoustically sealed apertures in the case to be connected to the associated external electronic circuitry.

The foregoing and other features, objects and advantages of the present invention will be apparent from the following more particular description of the preferred embodiment of the invention as illustrated in the accompanying drawings wherein:

DESCRIPTION OF THE DRAWINGS

FIG. 1 is an isometric view, partially in cross section, of an electret transducer in accordance with the invention;

FIG. 2 is a plan view of the case of FIG. 1 with a portion of the electret assembly and diaphragm removed to show a support post in the casing, on which post the electret assembly is mounted. FIG. 2 also shows the ceramic plate on which the electronic circuit is mounted and the base support for the ceramic plate;

FIG. 3 is a schematic diagram of a portion of the amplification circuit of FIG. 2 which includes a pair of field effect transistors (FET's) and associated circuit components; and, FIG. 4 is an isometric view of the ceramic plate 41 of FIGS. 1 and 2, essentially upside down or reversed with respect to FIGS. 1 and 2, to show the component mounting on plate 41.

DESCRIPTION OF THE INVENTION

Referring to FIG. 1, the electret transducer 11 of the invention comprises a cup-like case or housing 13, which in one embodiment includes essentially rectangularly shaped walls 15. A mating cover 17 which comprises a generally flat plate with downwardly angled or sloped corners 18 fits atop the walls 15 and is cemented thereon to close the case 13. The sloped corners 18 assist in conveniently and properly locating the cover 17 on the case 13 during the assembly operation. A suitable acoustical signal input tube 19 mounted on case 13 communicates through a suitable acoustical opening, indicated generally as numeral 40 in end wall 15 with the interior of the case, and more particularly with acoustic chamber 20 formed in case 13, as will be explained.

An electret transducer assembly 21 is mounted in case 13. The electret assembly is generally of the type described in U.S. Pat. No. 3,740,496 entitled "Diaphragm Assembly For Electret Transducer", filed in the names of E. V. Carlson and M. C. Killion and assigned to the same assignee as the present invention. Electret assembly 21 includes a one piece diaphragm 22 formed as a plate-like portion 23 which extends across the entire relatively flat bottom or lower surface 32 of case 13, and a surround 25. Diaphragm 22 may be of polyethylene terephthalate, commonly available under the trademark MYLAR or of any similar material. Plate-like portion 23 may be coated with a metallizing layer of conductive material, not shown, which may for example, be evaporated to its surface.

The surround 25 formed on the periphery of the plate-like portion 23, may also be metallized to provide an electrical terminal. The surround 25 includes a peripheral flange 26, extending transversely to the plane of plate-like portion 23. The flange 26 is formed to conform to the inner surface of the walls 15 of case 13. An integral tab which may be formed as an extension of flange 26 extends upward between the wall 15 and the electrical conductor connected to terminal 51, note conductive tab 73 in FIGS. 2 and 3. The upper surface of diaphragm 22 is thereby electrically connected to terminal 51 and the case 13 by the weld at 75.

A relatively rigid backplate 33 also extends across substantially the entire bottom or lower surface 32 of case 13. Backplate 33 is also dimensioned to fit or conform to the flange 26 on diaphragm 22. As seen from FIG. 1, the flange 26 of diaphragm 22 is disposed and adhered in position between the edges of backplate 33 and walls 15 of case 13. The diaphragm 22 and backplate 33 divide the case 13 into two acoustic chambers 20 and 24. Suitable apertures 35 in backplate 33 permit sound vibrations to pass from one acoustic chamber to the other.

A polarized dielectric film or electret 31 is formed on the lower surface of backplate 33 by suitable known means. In one embodiment, the electret film 31 may be placed or deposited on backplate 33 such as to flow through apertures 35 and extend to the opposite surface of backplate 33 to provide anchoring tabs for the film 31, for example, as described in U.S. Pat. No. 3,772,133, filed in the name of Thomas H. Schmitt, entitled "Backplate Construction For Electret Transducer", and assigned to the same assignee as the present invention. A flange 30 on film 31 may extend around the edge of backplate 33. Backplate 33 further includes a pattern of spaced protrusions 37 on its lower surface. Diaphragm plate-like portion 23 bears against protrusions 37 to properly position; that is to provide a precise spacing 42, between the diaphragm plate-like portion 23 and the section of the electret film 31 located between the protrusions.

A plurality of supporting posts 16, see also FIG. 2, are formed or mounted in a spaced pattern throughout the bottom or interior lower surface 32 of case 13. In the embodiment of FIG. 1, three posts 16 in triangular configuration, that align with three protrusions of the type 37 on the backplate 33 are utilized to support and securely mount the electret assembly 21 within the case 13. As mentioned, the posts 16 may be formed as indentations on the bottom 32 by depressing areas of the bottom 32 toward the interior of case 13. Alternatively, the posts 16 may be separate posts or support stubs welded or otherwise secured in selected pattern on the bottom 32 of case 13. Note that in addition to providing a secure support for assembly 21, the posts accurately define the dimensions of the acoustic chamber 20 which are formed between the diaphragm 22 and the bottom of case 13.

In assembly, the diaphragm 22 is positioned adjacent to the backplate 33. As explained above, the spacing between the diaphragm plate-like portion 23 and the planar portions of backplate 33 will be controlled by the protrusions 37 on backplate 33. The electret assembly or subassembly 21 comprising the backplate 33 and diaphragm 22 can then be inserted into the case 13 to rest on the posts 16 on the interior surface of the case to form the acoustic chamber 20, as noted above. The backplate 33 and the flange 26 of diaphragm 22 can then be secured to the walls 15 of case 13 such as by a nodule or fillet of glue 36.

A support plate 41 which may be of ceramic or other non-conductive material is mounted within the case 13 in spaced relation to the backplate 33, see both FIGS. 1 and 2. The plate 41 is positioned and mounted by an elongated rod 43 extending outwardly from one edge of the plane of plate 41. Rod 43 is fastened as by welding onto a transverse brace 45, which may be struck out from backplate backplate 33. Rod 43 may be supported on the side of brace 45, as shown, or also may conveniently be supported on top of the brace 45. Also, brace 45 can comprise a separate piece welded onto both backplate 33 and rod 43.

The other edge of ceramic plate 41 is mounted in the case 13 by means of relatively rigid electrical terminals 47, 49 and 51 each of which have a portion affixed to plate 41 and an opposite portion which extends as by cementing to terminal pads 54 on the insulating board 52 mounted to wall 15 of case 13. In addition, the plate 41 may be further secured in place by adhesive 77 placed between the sides of the plate and the wall of the case 13. The ends of the electrical terminals 47, 49 and 51 which are affixed to plate 41, also connect to the associated electronic circuitry 50, indicated in FIG. 3, which is mounted on plate 41. As mentioned above, numeral 73 in FIG. 2 indicates a grounding tab formed on the flange 26 of the diaphragm 22 for electrically connecting with terminal 51; and, reference numeral 75 indicates a weld point from terminal 51 to the case 13.

The electronic circuitry of FIG. 3 includes a pair of field effect transistors labeled FET-1 and FET-2, a pair of diodes 53 and 55 and a resistor 57. The circuit of FIG. 3 is a modification of the circuit described in U.S. Pat. No. 3,512,100 filed in the names of M. C. Killion, E. V. Carlson and M. D. Burkhard entitled "Audio Frequency Amplification Circuit" and assigned to the same assignee as the present invention.

In the embodiment shown in FIG. 3, FET-1 includes a drain electrode 65, a source electrode 67 and a gate electrode 63. The drain electrode 65 is connected through terminal 47 to a suitable power source, such as a battery or cell, not shown, having a voltage in the range of 0.9 to 20.0 volts and commonly between 0.9 and 2 volts.

The source electrode 67 is connected to the drain electrode 71 of FET-2. As is well known, FET-1 receives and amplifies the signal developed by the interaction of the diaphragm 22 and the electret 31.

The source electrode 74 of FET-2 is connected through a series resistor 57 to the other terminal 51 of the power source; terminal 51 is also connected through lead 61 and conductor 73 (shown in dotted lines), to the signal input source 60. Pad 58 shown in FIG. 4 indicates a conductor connecting to the amplifier circuit 50. Resistor 57 is selected to provide a voltage drop of between 10 millivolts and 100 millivolts when normal current is flowing therethrough. For instance, in an amplifier circuit which draws a 25 micro-amperes of current from the power supply a 1000 ohm resistor has been found to be effective in preventing damage to the circuit due to accidental electrostatic discharge through the terminals 47 and 49 when holding onto the case 13. The resistor 57 may be formed as part of a semiconductor die 48, note FIG. 4; or, alternatively resistor 57 may be a discrete component, or also the resistor 57 may also be deposited on plate 41 by printing or evaporation.

Gate electrode 63 of FET-1 is connected through parallel connected diodes 53 and 55 to the source electrode 74 of FET-2. The diodes 53 and 55 are connected in relatively opposite polarity and function in the same manner as disclosed in the above-cited U.S. Pat. No. 3,512,100. Gate electrode 69 of FET-2 also connects to diodes 53 and 55.

FIG. 4 indicates the amplifier circuit of FIG. 3 as comprising a single semiconductor die 48, which is mounted as by cementing or eutectic bonding to suitable printed circuitry on ceramic plate 41.

The circuit of FIG. 3 is an improvement of the circuit shown in U.S. Pat. No. 3,512,100 in that the second transistor FET-2 which functions as a load transistor is connected in the circuit. The signal output is obtained from terminals 49 and 51 across FET-2 which provides a low DC resistance and a high AC resistance. In addition, the improved circuit of FIG. 3 includes the series resistor 57 which is connected in the circuit to limit the maximum current flow through FET-1 or FET-2 in the event of electrostatic discharge to either the power supply terminal 47 or to the output terminal 49.

The input signal to the circuit 50 is indicated by a block 60 connected across the leads 28 and 73. As is known, the signal input to the circuit is dependent on the dynamic or instantaneous spacing of the diaphragm portion 23 with respect to the electret 31. The output of circuit 50 is an amplified electrical signal developed across terminals 49 and 51 which are representative of the input signal.

As is well known, the polarity of the terminals of the power source connected to each of the FET's depends on the polarity orientation or type of FET's used.

While the invention has been particularly shown and described with reference to a preferred embodiment thereof, it will be understood by those skilled in the art that various changes in form and details may be made therein without departing from the spirit and scope of the invention.

We claim:

1. An acoustical transducer, comprising, in combination, a case having a bottom and side walls; an electret assembly including a diaphragm having a central vibratable plate-like portion and a relatively flexible surround on the periphery of the plate-like portion, a backplate having apertures extending therethrough, protrusions on one surface of the backplate, and an electret film formed on the surface of the backplate having the protrusions, the electret film cooperating with the diaphragm to develop a signal; and, spaced support posts on the interior surface of the bottom of the case and selectively aligned with protrusions on the surface of the backplate for supporting the electret assembly in the case and for forming an acoustical chamber between the electret assembly and the interior surface of the bottom of said case.

2. An acoustical transducer as in claim 1 wherein said surround includes a flange on its periphery, said flange conforming to the wall surface of the case, and means for adhering said flange to said walls.

3. An apparatus as in claim 1 further including a case cover having a planar surface and sloped corners on said cover for conveniently locating the cover on the case for assembly purposes.

4. apparatus as in claim 1 further including a cover for said case, means securing said diaphragm and said backplate to the walls of said case, a non-conductive plate positioned in said case, a signal amplification circuit mounted on said non-conductive plate, said circuit comprising a pair of field effect transistors (FET's), said first FET receiving and amplifying the signal developed by the diaphragm and electret, and said second FET providing an output load impedance for said amplified signal.

5. An acoustical transducer as in claim 4 wherein said diaphragm and said backplate separate said case into two distinct acoustical chambers.

6. An apparatus as in claim 4 wherein terminal means attach said non-conductive plate to the side of said casing, and brace means affix said non-conductive plate to said backplate.

7. An apparatus as in claim 6 wherein a signal amplification circuit formed in a single semiconductor die is mounted on said plate.

8. An apparatus as in claim 4 wherein the amplification circuit is connectable to a low voltage power source and further wherein the FET's each have at least three electrodes, one electrode of the first FET connected to one side of the power source, a bias means comprising a pair of diodes connected in parallel, said diodes being connected with a polarity to pass current in respectively opposite directions, the second electrode connected to one terminal of the bias means, the third electrode of said first FET connected to the first electrode of said second FET, the second electrode of said second FET connected to the other terminal of the bias means whereby said second FET functions to provide a low DC load impedance and a high AC load impedance, and means for receiving the AC signal generated across said second FET.

9. An apparatus as in claim 8 wherein the signal amplification comprises a single semiconductor die.

10. An apparatus as in claim 8 further including resistance means connected in series with the DC current path traceable from the first to third electrodes of said FET's to thereby limit the current flow through said FET's to provide protection thereto such as from electrostatic discharges.

* * * * *